(12) United States Patent
Tseng et al.

(10) Patent No.: US 12,368,092 B2
(45) Date of Patent: *Jul. 22, 2025

(54) PACKAGE SUBSTRATE INSULATION OPENING DESIGN

(71) Applicant: Taiwan Semiconductor Manufacturing Co., Ltd., Hsinchu (TW)

(72) Inventors: Shu-Jung Tseng, Wuci Township (TW); Shyue-Ter Leu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/357,757

(22) Filed: Jul. 24, 2023

(65) Prior Publication Data

US 2023/0369193 A1  Nov. 16, 2023

Related U.S. Application Data

(63) Continuation of application No. 17/671,059, filed on Feb. 14, 2022, now Pat. No. 11,817,382, which is a continuation of application No. 16/987,140, filed on Aug. 6, 2020, now Pat. No. 11,251,114.

(60) Provisional application No. 63/018,587, filed on May 1, 2020.

(51) Int. Cl.
*H01L 23/498* (2006.01)
*H01L 21/48* (2006.01)

(52) U.S. Cl.
CPC .... *H01L 23/49838* (2013.01); *H01L 21/4857* (2013.01); *H01L 23/49811* (2013.01)

(58) Field of Classification Search
CPC ........... H01L 23/49838; H01L 21/4857; H01L 23/49811; H01L 23/145; H01L 23/3121; H01L 23/49894; H01L 23/49822
See application file for complete search history.

(56) References Cited

U.S. PATENT DOCUMENTS

| 7,465,885 | B2 | 12/2008 | Chi et al. | |
|---|---|---|---|---|
| 8,080,827 | B2 | 12/2011 | Shi | |
| 11,251,114 | B2* | 2/2022 | Tseng | H01L 23/49811 |
| 11,817,382 | B2* | 11/2023 | Tseng | H01L 23/49894 |
| 2013/0249076 | A1 | 9/2013 | Lee et al. | |
| 2018/0286797 | A1* | 10/2018 | Goh | H01L 21/486 |
| 2018/0315692 | A1* | 11/2018 | Marbella | H01L 23/49838 |

(Continued)

*Primary Examiner* — Douglas W Owens
(74) *Attorney, Agent, or Firm* — Slater Matsil, LLP

(57) ABSTRACT

A semiconductor package includes: a substrate; a first dielectric layer over the substrate; a first bond pad and a second bond pad over the first dielectric layer, the first bond pad having a first sidewall facing the second bond pad; a second dielectric layer over the first and the second bond pads; and an opening through the second dielectric layer and extending from the first bond pad to the second bond pad, the opening including a first area over and exposing the first bond pad, where in a top view, the opening exposes a first segment of the first sidewall disposed between a first edge and a second edge of the first area that intersect the first sidewall, where the first segment of the first sidewall is between a second segment and a third segment of the first sidewall, the second segment being covered by the second dielectric layer.

20 Claims, 17 Drawing Sheets

(56) References Cited

U.S. PATENT DOCUMENTS

| | | |
|---|---|---|
| 2019/0371711 A1* | 12/2019 | Cho ................. H01L 24/09 |
| 2020/0350209 A1 | 11/2020 | Chang et al. |
| 2021/0098380 A1 | 4/2021 | Chen et al. |
| 2021/0296220 A1 | 9/2021 | Hsu et al. |

* cited by examiner

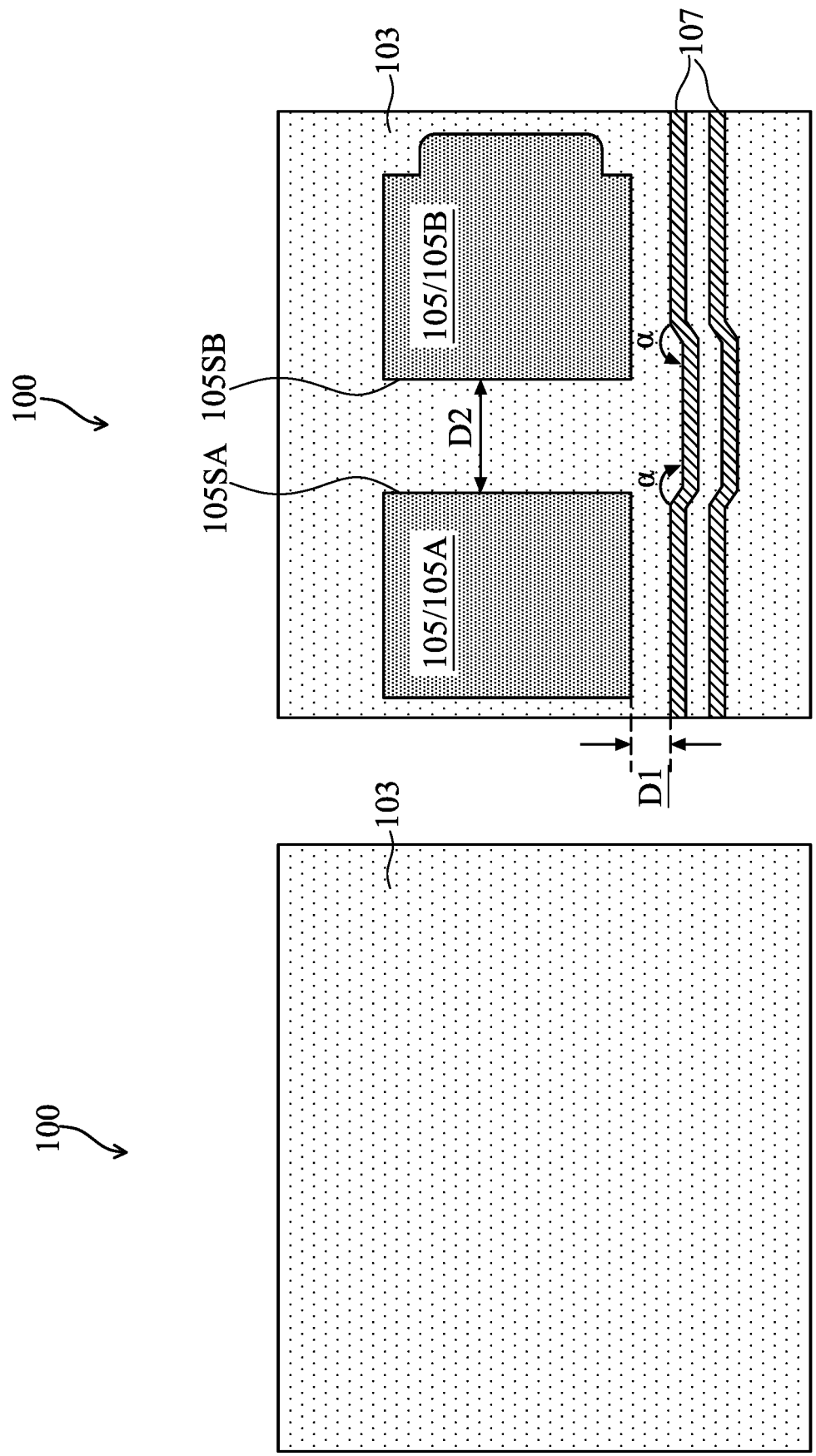

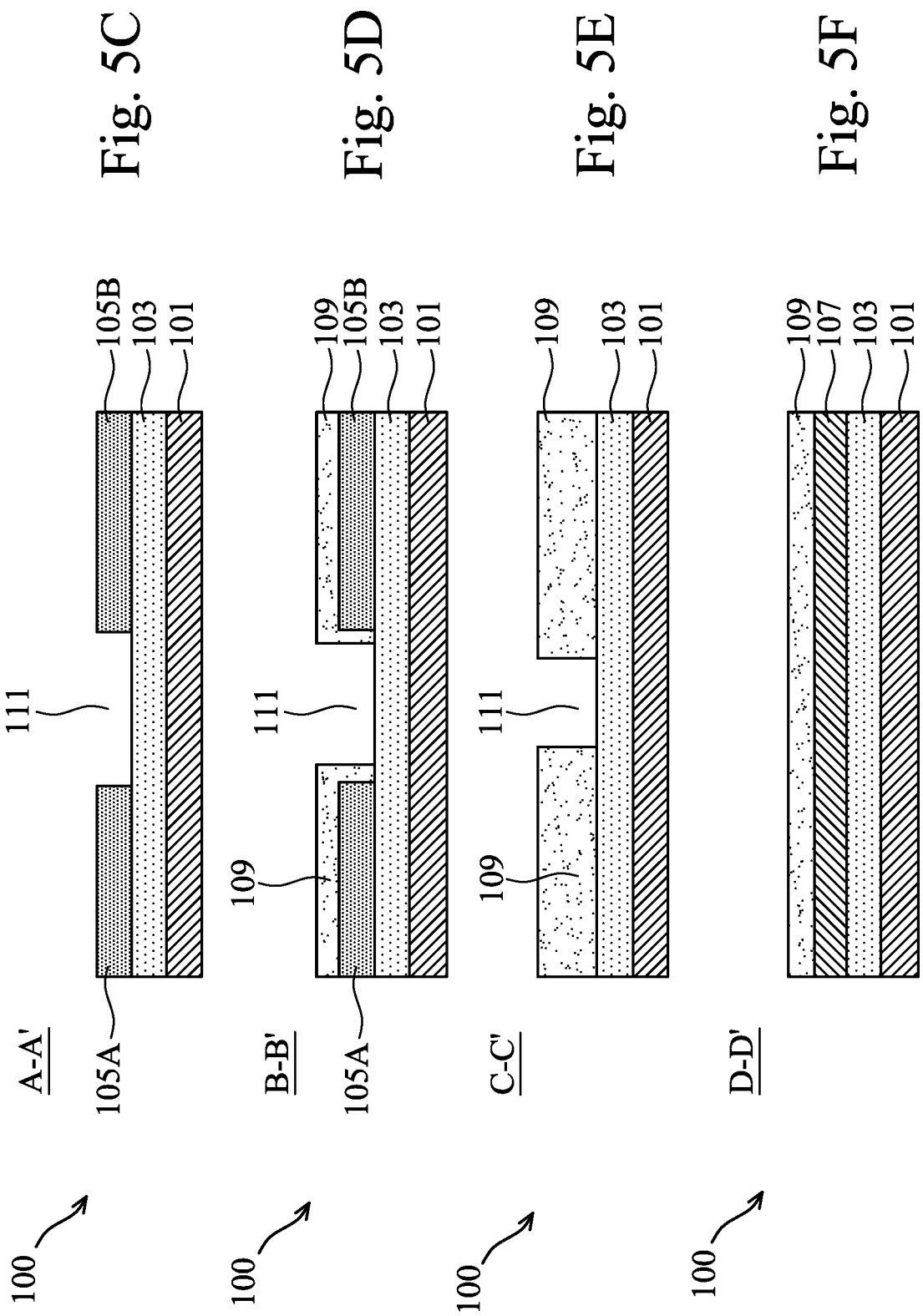

PACKAGE SUBSTRATE INSULATION OPENING DESIGN

CROSS-REFERENCE TO RELATED APPLICATIONS

This application is a continuation of U.S. patent application Ser. No. 17/671,059, filed on Feb. 14, 2022 and entitled "Package Substrate Insulation Opening Design," which is a continuation of U.S. patent application Ser. No. 16/987,140, filed on Aug. 6, 2020 and entitled "Package Substrate Insulation Opening Design", now U.S. Pat. No. 11,251,114 issued on Feb. 15, 2022, which claims the benefit of U.S. Provisional Application No. 63/018,587, filed on May 1, 2020 and entitled "SMD Insulation Opening Design," which applications are hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. As feature sizes continue to shrink in advanced semiconductor manufacturing nodes, new challenges arise that must be addressed.

SUMMARY

Various embodiments of semiconductor packages are disclosed. In some embodiments, the semiconductor package includes a first conductive pad, a second conductive pad, and a conductive line that are formed on a first dielectric layer, and includes a second dielectric layer formed on the first and second conductive pads and on the conducive line. The conductive line extends along sidewalls the first and second conductive pads. An opening is formed in the second dielectric layer to partially expose the first conductive pad and the second conductive pad. The shape, the size, and the location of the opening are designed to prevent or reduce the occurrence of the bridging issue (e.g., electrical short) between the first and the second conductive pads and the conductive line. The bridging issue may occur when undercuts are formed under the second dielectric layer due to the etching process used to form the opening. The undercuts may expose sidewalls of the first and second conductive pads and a sidewall of the conductive line, and may cause electrically short when the conductive material of a surface finish layer formed subsequently on the first and second conductive pads fills the undercuts. The disclosed embodiments prevent or reduce the occurrence of the bridging issue, thus improving device reliability and production yield.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-4, 5A-5G, 6A, 6B, 7, and 8 illustrate various views of a semiconductor package at various stages of fabrication, in an embodiment.

DETAILED DESCRIPTION

Figure 1:
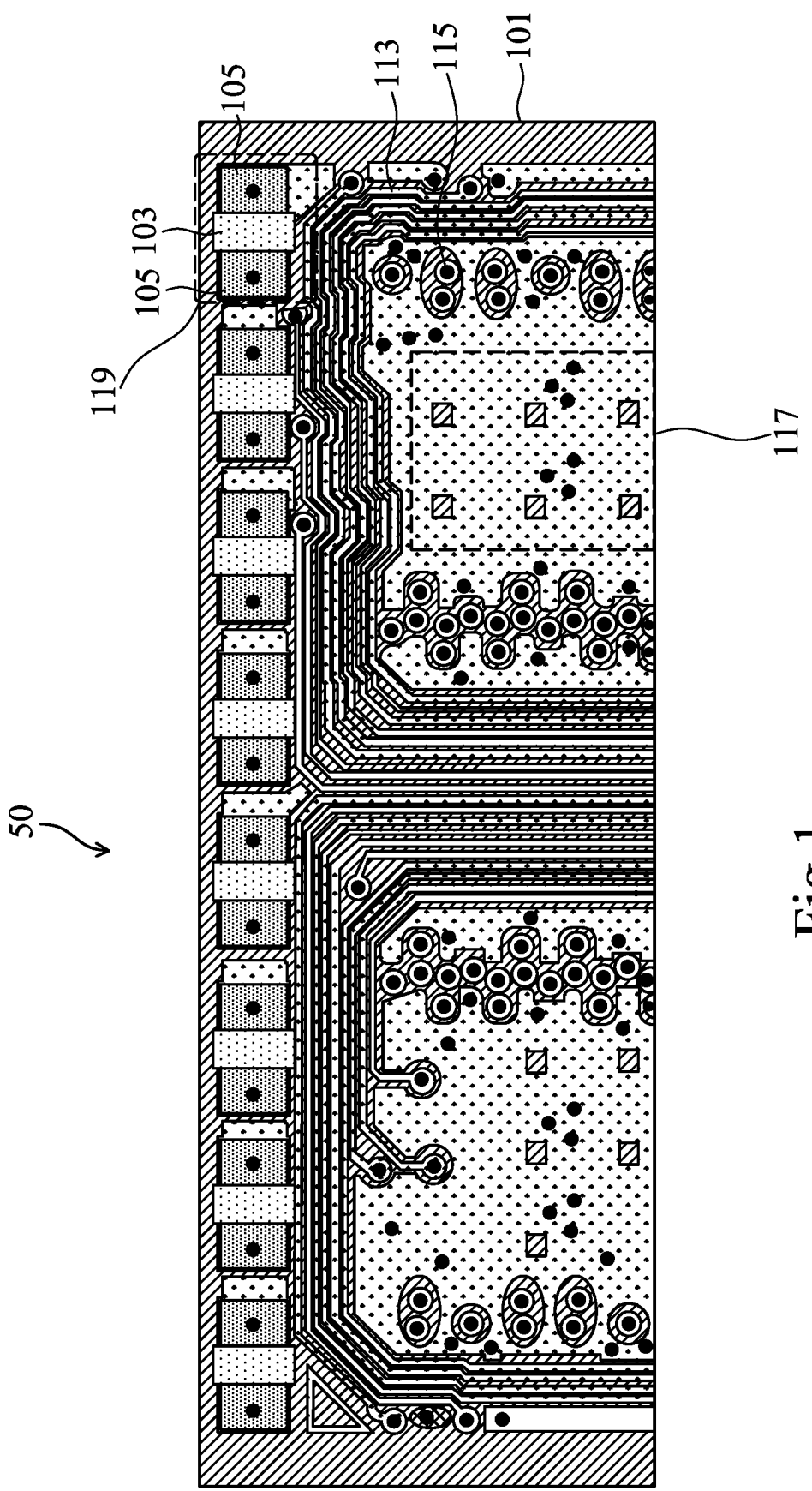
FIG. 1 illustrates a top view of package substrate, in an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference numeral in different figures refers to the same or similar components formed by a same or similar process using a same or similar material(s).

In some embodiments, a semiconductor package substrate includes a substrate, a first dielectric layer over the substrate, and a first bond pad and a second bond pad over the first dielectric layer. The semiconductor package substrate further includes a second dielectric layer over the first bond pad, the second bond pad, and the first dielectric layer, and an opening in the second dielectric layer that partially exposes the first bond pad and the second bond pad. In an embodiment, the first bond pad has a first sidewall facing the second bond pad, a first portion of the first sidewall of the first bond pad is exposed by the opening, and a second portion of the first sidewall is covered by the second dielectric layer. By covering the second portion of the first sidewall by the second dielectric layer, defects caused by bridging issue is reduced or avoided.

FIG. 1 illustrates a top view of package substrate 50, in an embodiment. The package substrate 50 may also be referred to as semiconductor package substrate, and may be used for packaging semiconductor dies to form semiconductor packages. For example, in semiconductor manufacturing, a plurality of semiconductor dies (also referred to as dies, or integrated circuit dies (IC dies)) are fabricated on a semiconductor wafer. The semiconductor wafer is then singulated to form a plurality of individual dies. After singulation, the dies are tested, and the known good dies (KGDs) are attached to package substrates to form semiconductor packages. A semiconductor package may include a metal, plastic, glass, or ceramic casing containing one or more semiconductor dies. The semiconductor package provides a means for electrically connecting the dies inside the semiconductor package to the external environment, such as a printed circuit board (PCB), via leads of the semiconductor package, such as lands, bond pads, balls, or pins. The semiconductor package also provides protection of the die against adverse environmental factors such as mechanical impact, chemical contamination, and light exposure.

As illustrated in FIG. 1, the package substrate 50 comprises a substrate 101 (e.g., a dielectric core), conductive lines 113 (e.g., copper lines) and conductive pads 115 (e.g., copper pads) on surfaces of the substrate 101. FIG. 1 also illustrates an area 117 for attaching a semiconductor die to the package substrate 50. In addition, along a perimeter (e.g., upper edge in FIG. 1) of the package substrate 50, a plurality of bond pads 105 are formed over a dielectric layer 103 (e.g., a solder resist), which dielectric layer 103 is formed over the substrate 101. In some embodiments, the bond pads 105 are used for attaching (e.g., bonding) surface mount devices (SMDs) to the package substrate 50. For example, in an area 119 of the package substrate 50, two bond pads 105 are formed, which may be used for bonding a two-terminal SMD device, such as a resistors, capacitors, or the like.

Figure 7:
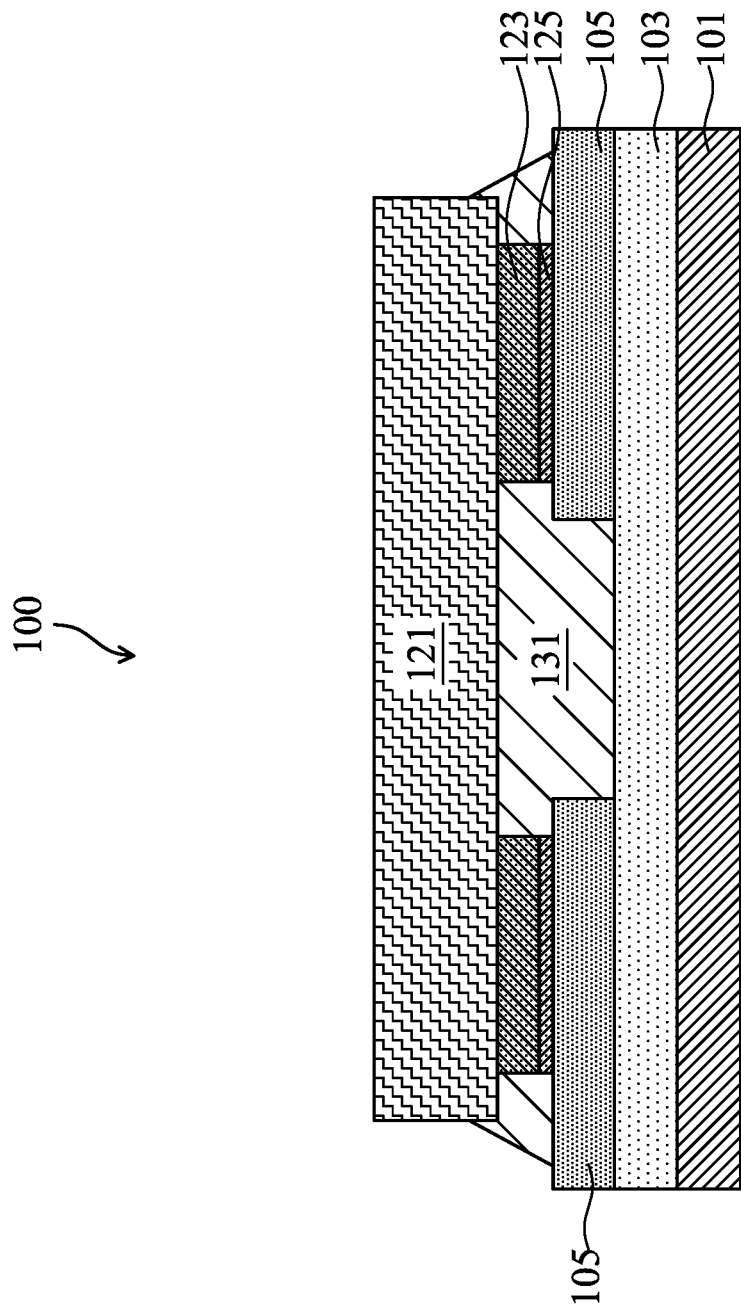
Figure 8:
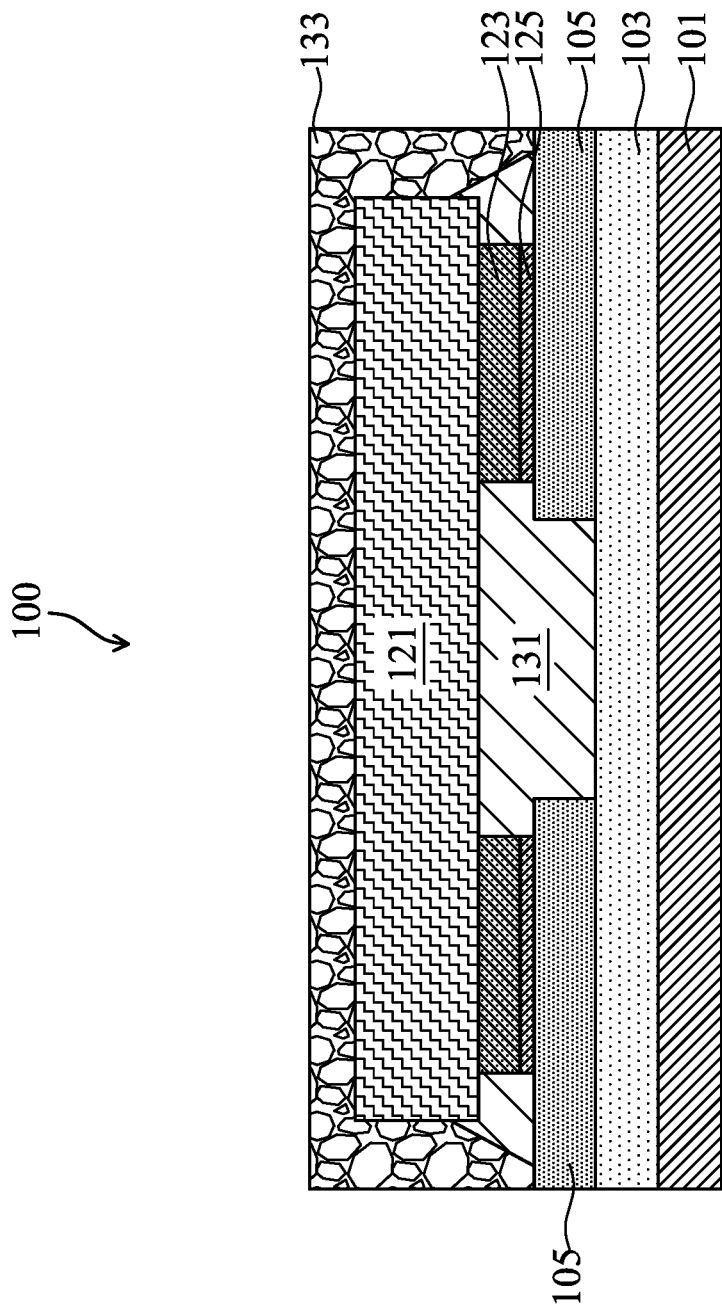

FIGS. 2-4, 5A-5G, 6A, 6B, 7, and 8 illustrate various views (e.g., cross-sectional view, top view) of a semiconductor package 100 at various stages of fabrication, in an embodiment. In particular, FIGS. 2-4 and 5A-5G illustrates processing steps for a package substrate, and subsequent figures show devices (e.g., SMD and/or semiconductor dies) being bonded to the package substrate to form the semiconductor package 100. FIGS. 2-4, 5A, 5B, and 6A illustrate top views of the semiconductor package 100. FIGS. 5C-5F illustrate cross-sectional view of the semiconductor package 100 along cross-sections A-A', B-B', C-C', and D-D' in FIG. 5A, respectively. FIG. 5D illustrates a zoomed-in view of an area 150 in FIG. 5A. FIGS. 6B, 7, and 8 illustrate cross-sectional views of the semiconductor package 100 along cross-section E-E' in FIG. 6A. Note that for simplicity, FIGS. 2-4, 5A-5G, 6A, 6B, 7, and 8 illustrate only a portion of the semiconductor package 100, and not all features of the semiconductor package 100 are illustrated in the figures. For example, the portion of package substrate illustrated in FIGS. 2-4, 5A-5G, 6A, 6B, 7, and 8 may correspond to the portion of the package substrate 50 in the area 119 of FIG. 1.

Referring to FIG. 2, a dielectric layer 103 is formed over a substrate 101 (not illustrated in FIG. 2, but illustrated in FIGS. 5C-5F). The substrate 101 may be or include a dielectric core, which is formed of a dielectric material such as resin or fiber glass. For example, the dielectric core may include bismaleimide triazine (BT) resin, FR-4 (a composite material composed of woven fiberglass cloth with an epoxy resin binder that is flame resistant), ceramic, glass, plastic, tape, film, or other supporting materials. In some embodiments, electrically conductive features, such as copper lines and/or copper pads, are formed on opposing sides of the dielectric core and may serve as redistribution layers to re-route electrical signals from a first location(s) of the substrate 101 to a second location(s) of the substrate 101. Conductive vias are formed to extend through the dielectric core, and are electrically coupled to the conductive features of the redistribution layer. The dielectric layer 103 may be a suitable dielectric material, such as solder resist, Ajinomoto Build-up Film (ABF), PREPREG, polyimide, or the like, formed by a suitable formation method such as physical vapor deposition (PVD), chemical vapor deposition (CVD), spin coating, lamination, or the like. A planarization process, such as chemical and mechanical planarization (CMP), may be performed next to achieve a level upper surface for the dielectric layer 103.

Next, in FIG. 3, bond pads 105 and conductive lines 107 are formed over the dielectric layer 103. The bond pads 105 and the conductive lines 107 are formed of an electrically conductive material, such as copper, although other suitable material, such as tungsten, cobalt, gold, alloys thereof, or the like, may also be used. In some embodiments, to form the bond pads 105 and the conductive lines 107, a seed layer is formed over the dielectric layer 103 (e.g., by PVD or CVD), and a patterned photoresist layer is then formed over the seed layer, where locations of the patterns (e.g., openings) of the patterned photoresist layer correspond to locations of the bond pads 105 and the conductive lines 107. Next, an electrically conductive material, such as copper, is formed in the openings of the patterned photoresist layer, e.g., by a plating process. Next, the patterned photoresist layer is removed, and portions of the seed layer over which no electrically conductive material is formed are removed. Besides the above describe formation method, other methods for forming the bond pads 105 and the conductive lines 107 are also possible, and are fully intended to be included within the scope of the present disclosure.

In the example of FIG. 3, the bond pad 105 (e.g., 105A or 105B) comprises a rectangular shaped area of conductive material. The bond pad 105A has a sidewall 105SA facing the bond pad 105B, and the bond pad 105B has a sidewall 105SB facing the bond pad 105A. The sidewalls 105SA and 105SB are parallel to each other, in the example of FIG. 3. A distance D2 between sidewalls 105SA and 105SB may be larger than 100 μm and smaller than about 1000 μm (e.g., 100 μm<D2<1000 μm). The bond pads 105A and 105B are aligned horizontally such that horizontal sidewalls of the bond pad 105A in FIG. 3 and respective horizontal sidewalls of the bond pad 105B are aligned along the same horizontal lines.

The conductive lines 107 extend along a sidewall of the bond pad 105A (or 105B) intersecting the sidewall 105SA (or 105SB), such as along a direction perpendicular to the sidewalls 105A/105B. A distance D1 (e.g., a shortest distance) between the bond pad 105 and the conductive line 107 is smaller than about 40 μm (e.g., 0 μm<D1<40 μm). Note that a portion of the conductive line 107 disposed laterally between the bond pads 105 are shifted away from the bond pads 105, thereby forming an obtuse angle α (e.g., 90 degrees<α<180 degree) between segments of the conductive line 107. This pattern of the conductive line 107 illustrated in FIG. 3 may be referred to as having a beveled design. As will be discussed later in the present disclosure, the beveled design of the conductive line 107, together with a beveled design of a subsequently formed opening 111, help to reduce defects caused by bridging (e.g., electrical short) in the manufacturing of the semiconductor package. In some embodiments, the angle α is 120 degrees or 135 degrees. In some embodiments, the angle α is chosen to match the angle θ (see FIG. 5B) of the beveled design of the opening 111.

Figure 4:
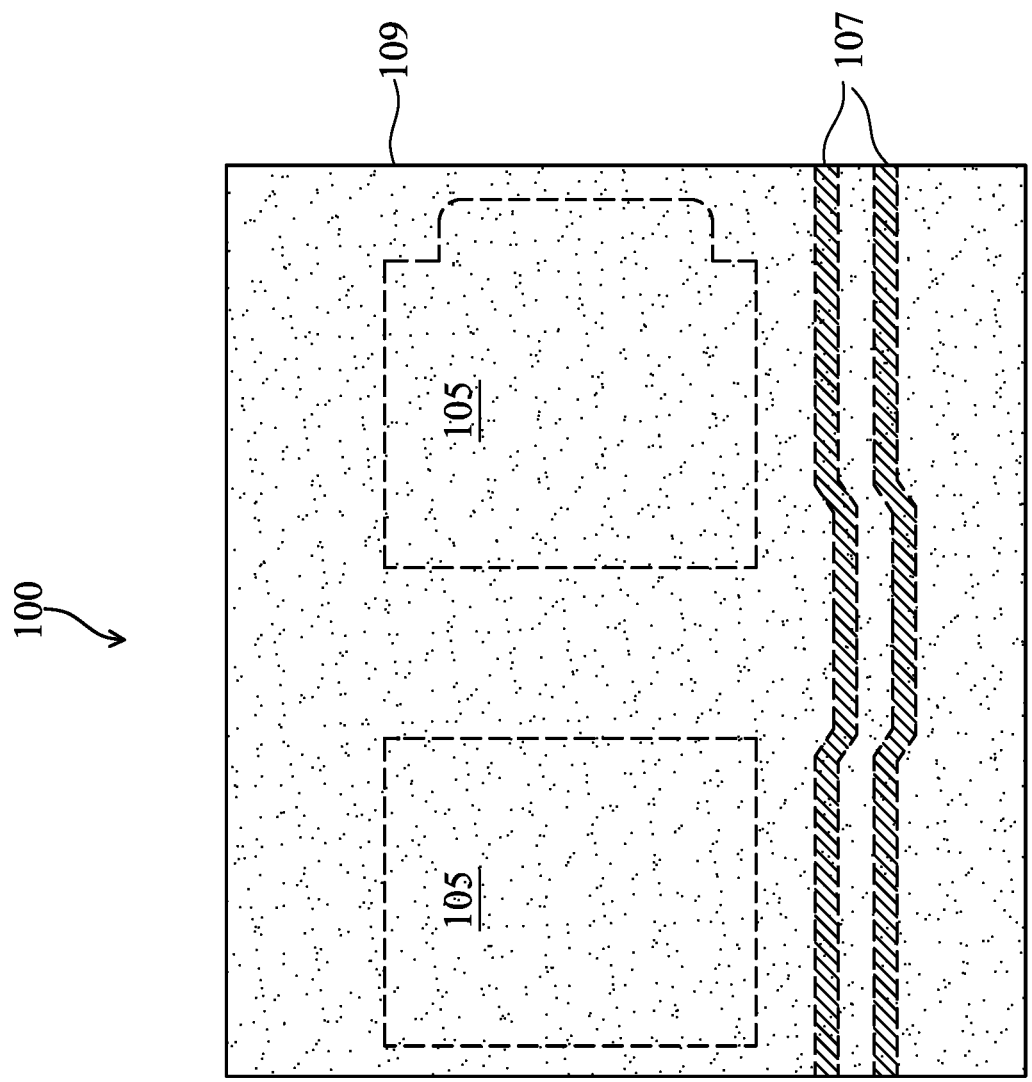
Figure 5A:
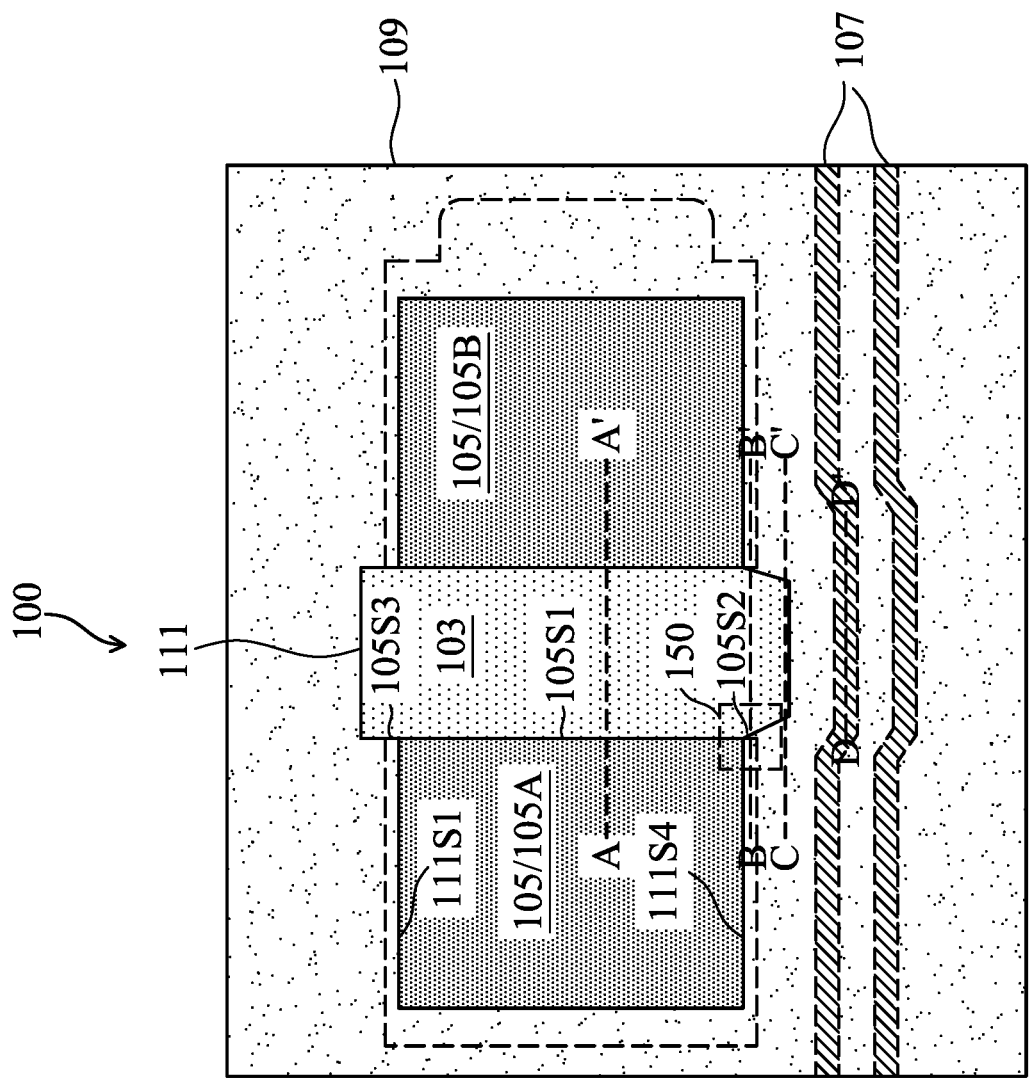

Next, in FIG. 4, a dielectric layer 109 is formed over the bond pads 105, the conductive lines 107, and the dielectric layer 103. The dielectric layer 109 may be a suitable dielectric layer, such as solder resist, ABF, PREPREG, polyimide, or the like, formed by a suitable formation method such as PVD, CVD, spin coating, lamination, or the like. A planarization process, such as CMP, may be performed next to achieve a level upper surface for the dielectric layer 109. Note that the bond pads 105 and the conductive lines 107 are illustrated in phantom in FIG. 4, since they are not visible in the top view of FIG. 4.

Next, in FIG. 5A, an opening 111 is formed in the dielectric layer 109, e.g., using photolithography and etching techniques, to expose a portion of the bond pad 105A, a portion of the bond pad 105B, and a portion of the dielectric layer 103 between the bond pads 105A and 105B. For example, a patterned photoresist layer may be formed over the dielectric layer 109, and an etching process (e.g., an anisotropic etching process) is performed next to form the opening 111. The patterned photoresist layer is then removed by a suitable removal process, such as ashing. To avoid cluttering, FIG. 5B illustrates the dielectric layer 109 and the opening 111 only.

Figure 5B:
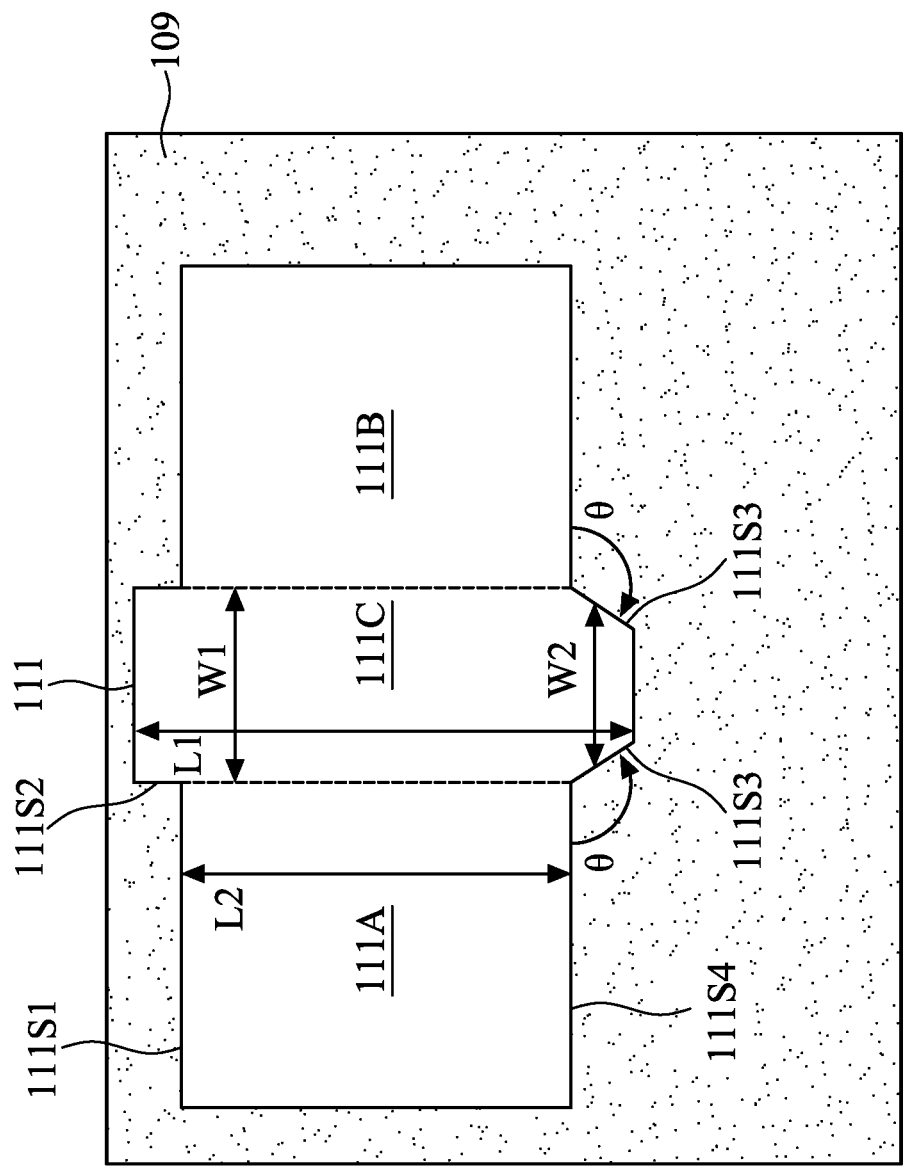

Referring to FIGS. 5A and 5B, the opening 111 comprises an area 111A over (e.g., directly over) the bond pad 105A, an area 111B over (e.g., directly over) the bond pad 105B, and an area 111C between the areas 111A and 111B. In the example of FIGS. 5A and 5B, the opening 111 extends continuously from the bond pad 105A to the bond pad 105B. Each of the areas 111A and 111B has a rectangular shape, and is smaller than the area of the respective underlying bond pad 105. Each of the areas 111A and 111B is positioned such that all but one sidewall of the underlying bond pad 105 are covered by the dielectric layer 109, and only one sidewall of the underlying bond pad 105 is exposed by the opening 111. In particular, the opening 111 exposes the sidewall 105SA (see label in FIG. 3) of the bond pad 105A, and exposes the sidewall 105SB (see label in FIG. 3) of the bond pad 105B.

As illustrated in FIG. 5B, a length L1 of the area 111C is larger than a length L2 of the area 111A (or 111B). In the top views of FIGS. 5A and 5B, the area 111C comprises a rectangular shaped area and a trapezoidal shaped area. The trapezoidal shaped area protrudes toward the conductive lines 107 (see FIG. 5A), and therefore, may also be referred to as a protruding portion of the area 111C. The width W1 of the rectangular shaped area is the same as the distance D2 (see label in FIG. 3) between the bond pads 105, and may remain substantially constant in the rectangular shaped area, in the illustrated embodiment. In an embodiment, the width W1 is larger than about 100 μm, such that the width W1 is larger enough for a subsequently formed underfill material (or a molding material) to flow into and fill the space between the bond pads 105. The width W2, measured between the two legs of the trapezoidal shaped area, decreases as the trapezoidal shaped area (the protruding portion of the area 111C) extends toward the conductive line 107 (see FIG. 5A). In some embodiments, the width W1 is larger than the width W2.

In FIG. 5B, an angle θ, measured between a sidewall 111S3 (e.g. a leg of the trapezoidal shaped area) and a sidewall 111S4 of the area 111A intersecting the sidewall 111S3, is an obtuse angle, e.g., larger than 90 degrees and smaller than 180 degrees, such as 120 degrees or 135 degrees. Due to the angle θ being an obtuse angle, the opening 111 is referred to as having a beveled design. Note that in FIG. 5B, a sidewall 111S2 of the rectangular shaped area and a sidewall 111S1 of the area 111A intersecting the sidewall 111S2 form a right angle. In some embodiments, in the top view of FIG. 5B, the opening 111 is symmetric about a center axis of the opening 111 extending along the direction of L1.

Referring back to FIG. 5A, the sidewall 105SA (see label in FIG. 3) of the bond pad 105A includes a first portion 105S1 (also referred to as a first segment), a second portion 105S2 (also referred to as a second segment), and a third portion 105S3 (also referred to as a third segment). In the top view of FIG. 5A, the first portion 105S1 is disposed between sidewalls 111S1 and 111S4 of the opening 111. The second portion 105S2 and the third portion 105S3 are disposed on opposing sides of the first portion 105S1. In the discussion herein, the sidewalls (e.g., 111S1, 111S4) of the opening 111 may also be referred to as edges of the openings.

Notably, the first portion 105S1 of the sidewall of the bond pad 105A is exposed by the opening 111 (e.g., not covered by the dielectric layer 109), and the second portion 105S2 of the sidewall of the bond pad 105A is covered by the dielectric layer 109. The cross-sectional views illustrated in FIGS. 5C and 5D, which are cross-sectional views across cross-section A-A' and B-B' in FIG. 5A, respectively, further illustrate the above description. In FIG. 5A, the third portion 105S3 of the sidewall of the bond pad 105 is exposed by the opening 111.

Figure 5G:
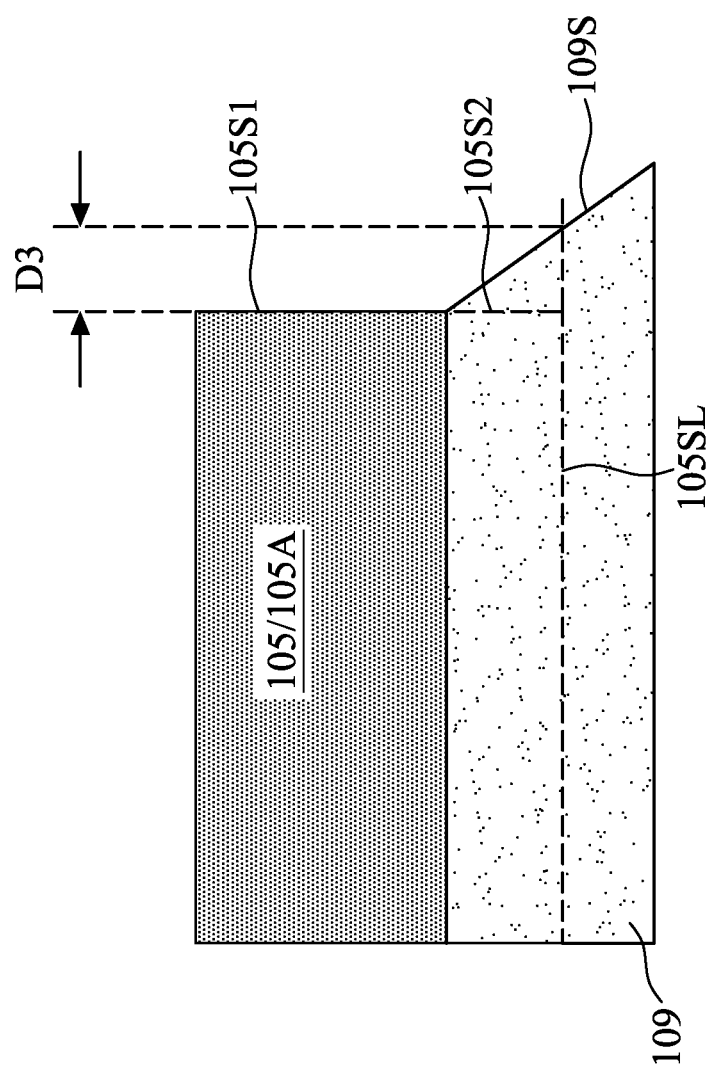

FIG. 5G illustrates a zoomed-in view of an area 150 of FIG. 5A. As illustrated in FIG. 5G, a distance D3, measured between the second portion 105S2 of the sidewall of the bond pad 105A and a sidewall 109S of the dielectric layer 109, increases as the second portion 105S2 extends toward the conductive line 107 (see FIG. 5A). A largest value D3max for the distance D3, measured along the horizontal direction of FIG. 5G at a sidewall 105SL (e.g., a sidewall closest to the conductive line 107), is at least 5 μm (e.g., D3max>5 μm), in some embodiments.

In some embodiments, after the opening 111 is formed, a surface finish layer, such as an electroless nickel electroless palladium immersion gold (ENEPIG) layer, is formed over the exposed surfaces of the bond pads 105 (e.g., copper pads) to protect the bond pads from oxidization and to improve the solderability of the bond pads 105. During the etching process to form the opening 111, undesired undercut of the dielectric layer 109 may occur. The current disclosed embodiments may advantageously prevent or reduce bridging issue caused by the undercut of the dielectric layer 109.

To appreciate the advantages of the present disclosure, consider a reference design for the opening 111, where the second portion 105S2 (e.g., a portion proximate to the conductive line 107) of the sidewalls of the bond pad 105 is exposed by the opening 111 (e.g., not covered by the dielectric layer 109). When undercut of the dielectric layer 109 occurs, the undercut may extend to the conductive line 107, and may expose portions of the sidewalls of the bond pads 105 facing the conductive line 107, and may expose portions of the sidewall of the conductive line 107 facing the bond pads 105. During the formation of the surface finish layer (e.g., an ENEPIG layer), the conductive materials of the surface finish layer may be formed along the exposed portions of the sidewalls of the bond pads 105 and along the exposed portions of the sidewall of the conductive line 107. Due to the short distance D1 between the bond pads 105 and the conductive line 107, bridging (e.g., electrical short) between the bond pads 105 and the conductive line 107 may occur, if the materials of the surface finish layer along sidewalls of the bond pads 105 and along the sidewall of the conductive line 107 merge together. The current disclosure, by forming the opening 111 with beveled design, covers the second portion 105S2 of the sidewall of the bond pad 105, thereby reducing the likelihood that the undercut of the dielectric layer 109 exposes the sidewall of the bond pad 105 facing the conductive line 107, and also reduces the likelihood that the undercut extends to, thus exposing, the conductive line 107. As a result, the possibility of bridging is greatly reduced. Note that the beveled design for the conductive line 107 also helps to reduce the possibility that the undercut reaches the conductive line 107, thereby reducing the possibility of bridging.

Figure 6A:
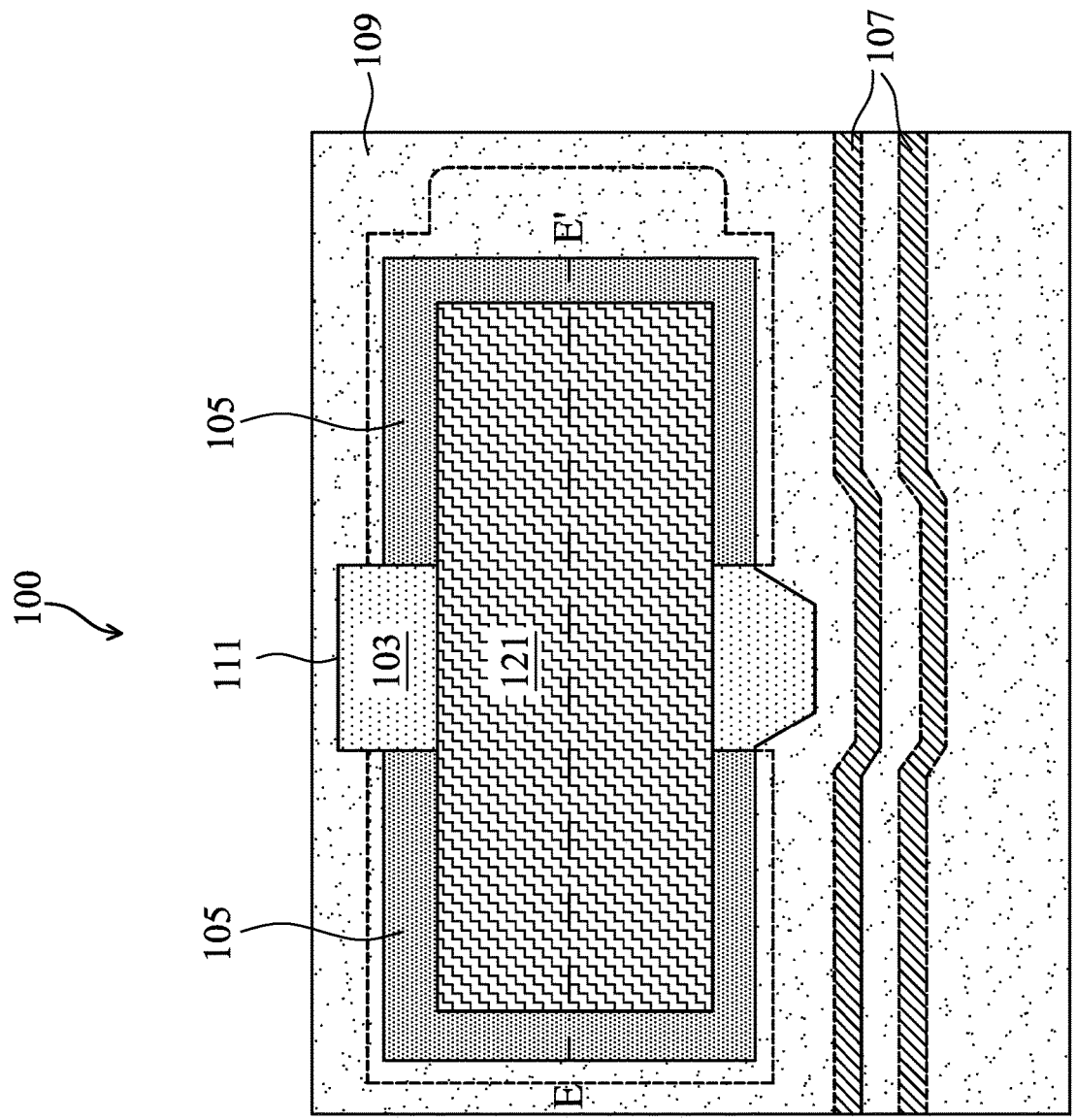
Figure 6B:
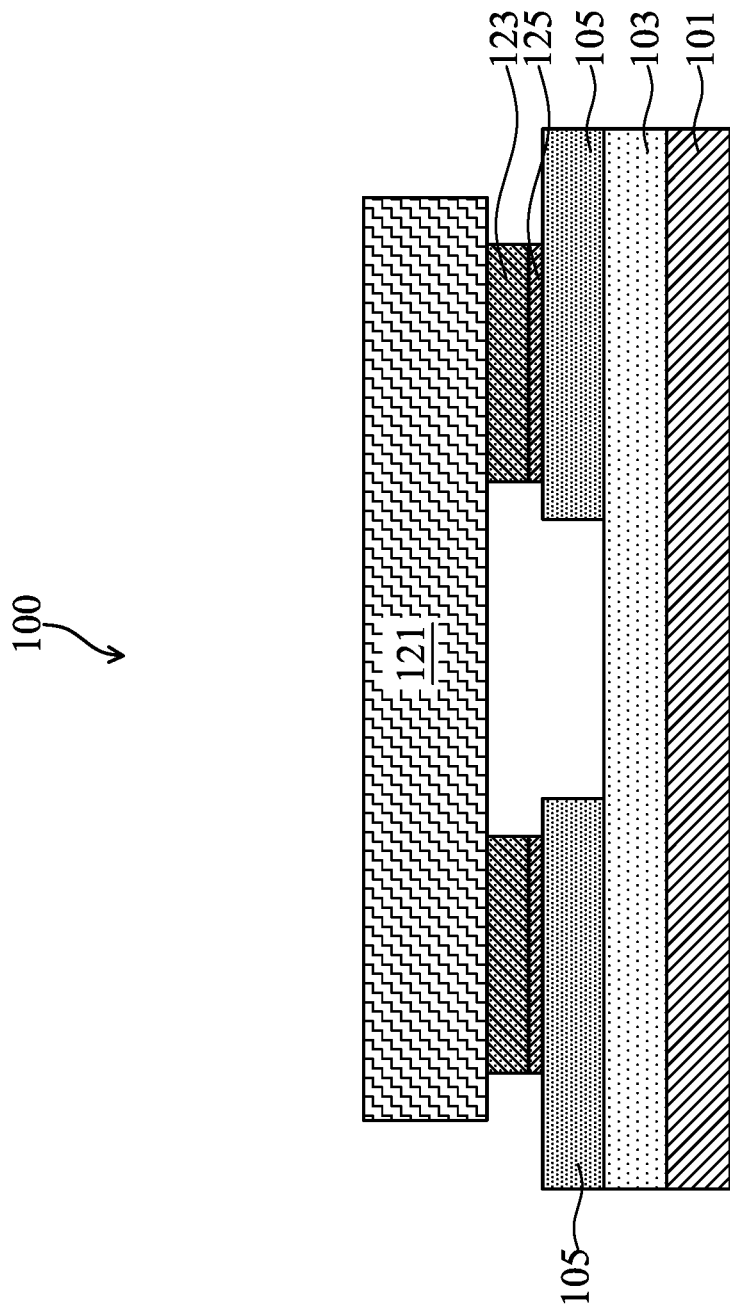

Next, in FIG. 6A, a SMD 121 is bonded to the bond pads 105. FIG. 6B illustrates the semiconductor package 100 of FIG. 6A, but along cross-section E-E' in FIG. 6A. As illustrated in FIG. 6B, terminals 123 (which may be or include solder joints) of the SMD 121 are attached to the bond pads 105 by, e.g., solder paste 125, and a reflow process may be performed to bond the SMD 121 to the bond pads 105. Although not shown, one or more semiconductor dies may be bonded to respective conductive pads of the package substrate, e.g., in die attaching areas such as the area 117 of FIG. 1.

Next, in FIG. 7, an underfill material 131 is formed in spaces under the SMD 121, such as between the bond pads 105 and around the terminals 123 of the SMD 121. Example materials of the underfill material 131 include, but are not limited to, polymers and other suitable non-conductive materials. The underfill material 131 may be dispensed in the gap between the SMD 121 and the dielectric layer 103 using, e.g., a needle or a jetting dispenser. A curing process may be performed to cure underfill material 131.

Next, in FIG. 8, a molding material 133 is formed over the SMD 121 and around the underfill material 131. The molding material 133 may comprise an epoxy, an organic polymer, a polymer with or without a silica-based or glass filler added, or other materials, as examples. In some embodiments, the molding material 133 comprises a liquid molding compound (LMC) that is a gel type liquid when applied. The molding material 133 may also comprise a liquid or solid when applied. Alternatively, the molding material 133 may comprise other insulating and/or encapsulating materials. The molding material 133 is applied using a wafer level molding process in some embodiments. The molding material 133 may be molded using, for example, compressive molding, transfer molding, or other methods.

Next, the molding material 133 is cured using a curing process, in some embodiments. The curing process may comprise heating the molding material 133 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 133 may be cured using other methods. In some embodiments, a curing process is not included.

Figure 9:
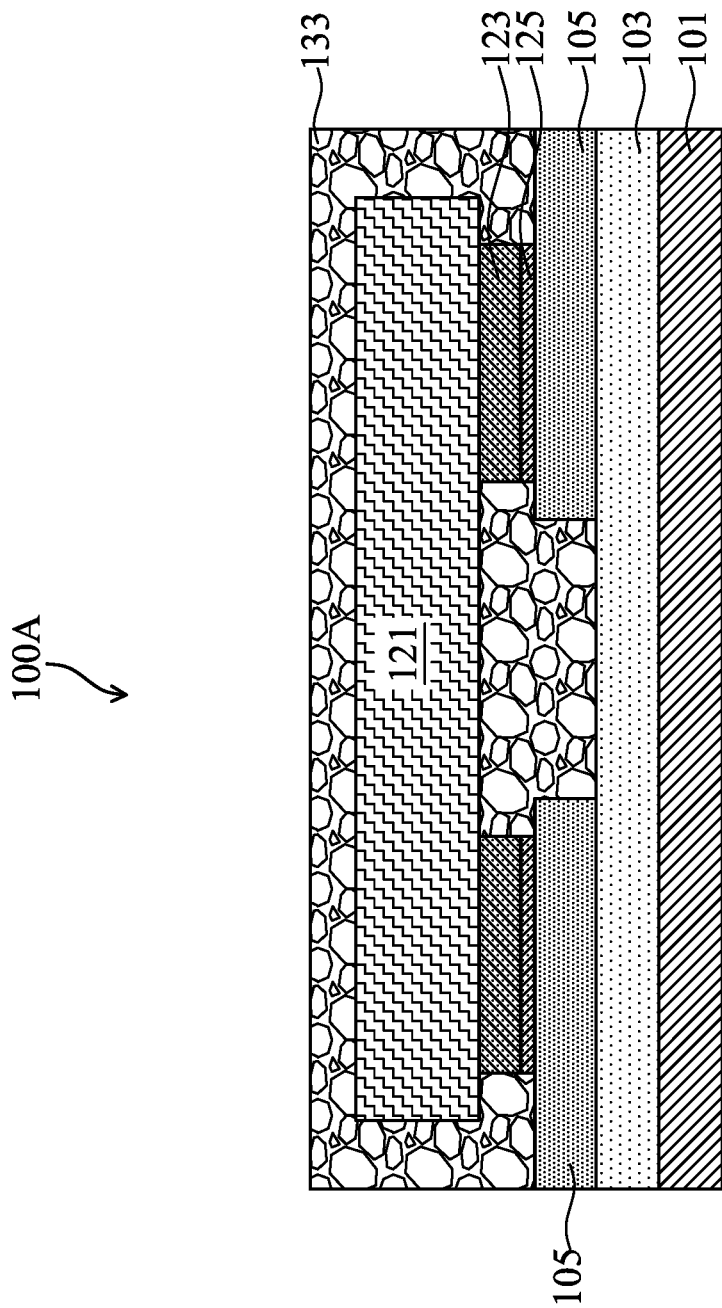
FIG. 9 illustrates a cross-sectional view of a semiconductor package, in accordance with an embodiment.

FIG. 9 illustrates a cross-sectional view of a semiconductor package 100A, in accordance with an embodiment. The semiconductor package 100A is similar to the semiconductor package 100 of FIG. 8, but without the underfill material 131. Instead, the molding material 133 fills the space between the SMD 121 and the dielectric layer 103, and encapsulates the SMD 121. The underfill material 131 and/or the molding material 133 may be referred to as an encapsulating material.

Figure 10:
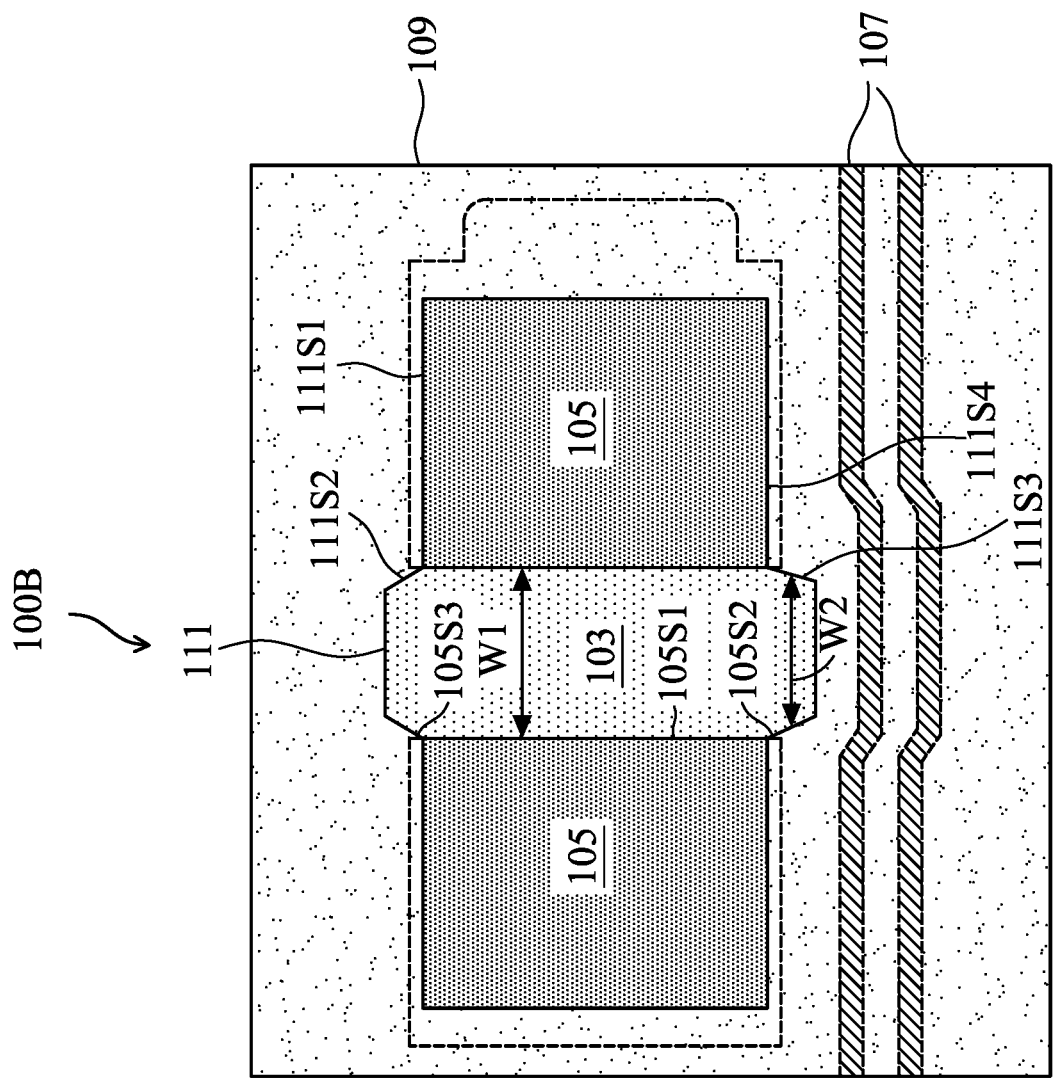
FIG. 10 illustrates a cross-sectional view of a semiconductor package, in accordance with another embodiment.

FIG. 10 illustrates a cross-sectional view of a semiconductor package 100B, in accordance with another embodiment. The semiconductor package 100 is similar to the semiconductor package 100 of FIG. 5A, but the area 111C (e.g., the area between the bond pads 105 in the top view of FIG. 10) of the opening 111 comprises a rectangular shaped area and two trapezoidal shaped areas on opposing sides of the rectangular shaped area. In some embodiments, the shape and dimension of each of the trapezoidal shaped areas in FIG. 10 are the same as or similar to those discussed above with reference to FIG. 5A, thus details are not repeated. In FIG. 10, the second portion 105S2 and the third portion 105S3 of the sidewall of the bond pad 105 are covered by the dielectric layer 109. Note that since the SMDs 121 (and semiconductor dies) are not yet attached in the processing step of FIG. 10, the semiconductor package 100B of FIG. 10 actually shows the packaging substrate of the semiconductor package to be formed later. Similarly, FIGS. 11-13 shows the packaging substrate of a respective semiconductor package.

Figure 11:
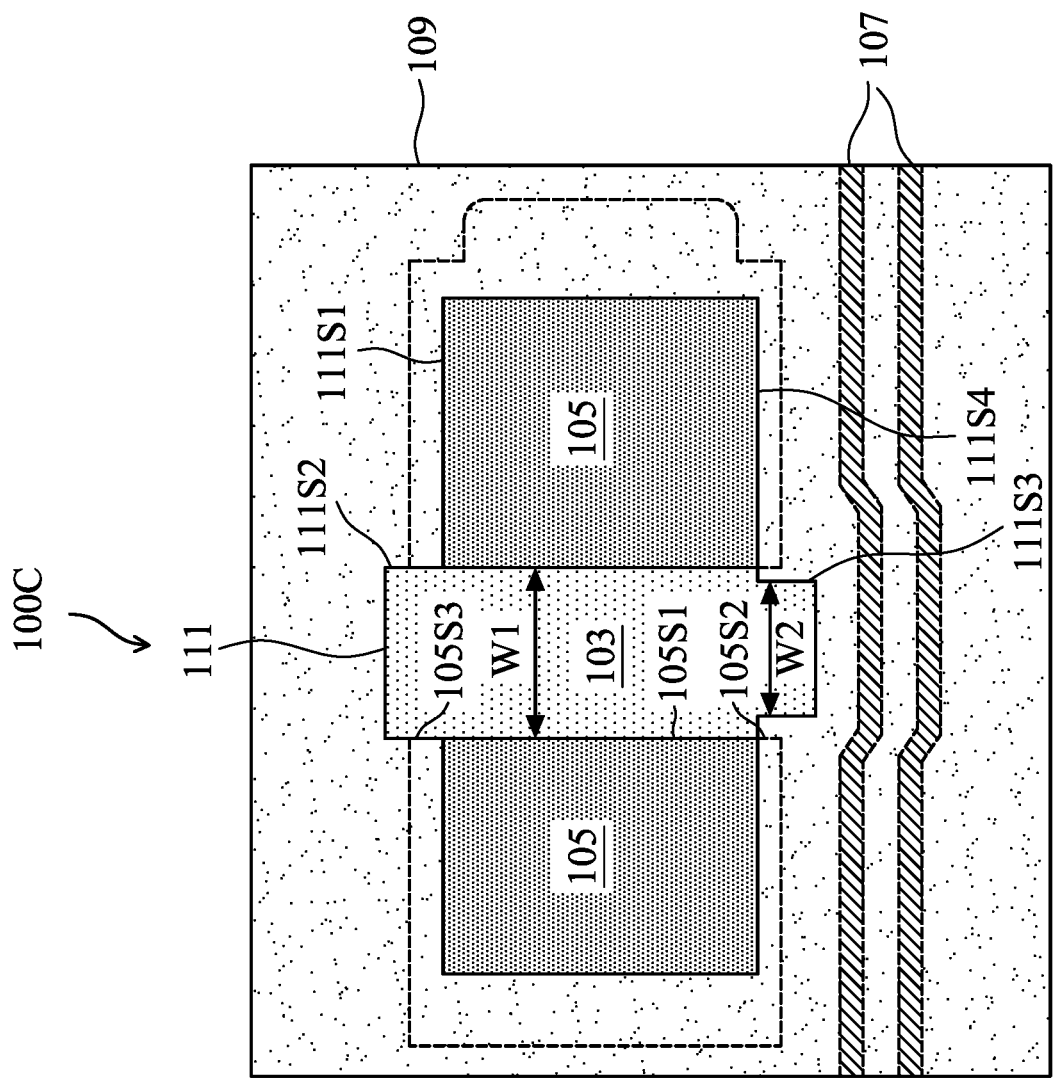
FIG. 11 illustrates a cross-sectional view of a semiconductor package, in accordance with another embodiment.

FIG. 11 illustrates a cross-sectional view of a semiconductor package 100C, in accordance with another embodiment. The semiconductor package 100C is similar to the semiconductor package 100 of FIG. 5A, but the trapezoidal shaped area of the area 111C of the opening 111 is replaced with a rectangular shaped area with a width W2, where W2 is smaller than the width W1. In other words, in the top view of FIG. 11, the area 111C comprises a larger rectangular shaped area with a width W1, and a smaller rectangular shaped area with a width W2. Note that due to the smaller width W2, the smaller rectangular shaped area causes the second portion 105S2 of the sidewall of the bond pad 105 to be covered by the dielectric layer 109. A distance between the second portion 105S2 of the sidewall of the bond pad 105 and a corresponding sidewall (e.g., a closest sidewall) of the dielectric layer 109 remain substantially constant, due to the smaller rectangular shaped area of the opening 111. In FIG. 11, the third portion 105S3 of the sidewall of the bond pad 105 is exposed by the opening 111.

Figure 12:
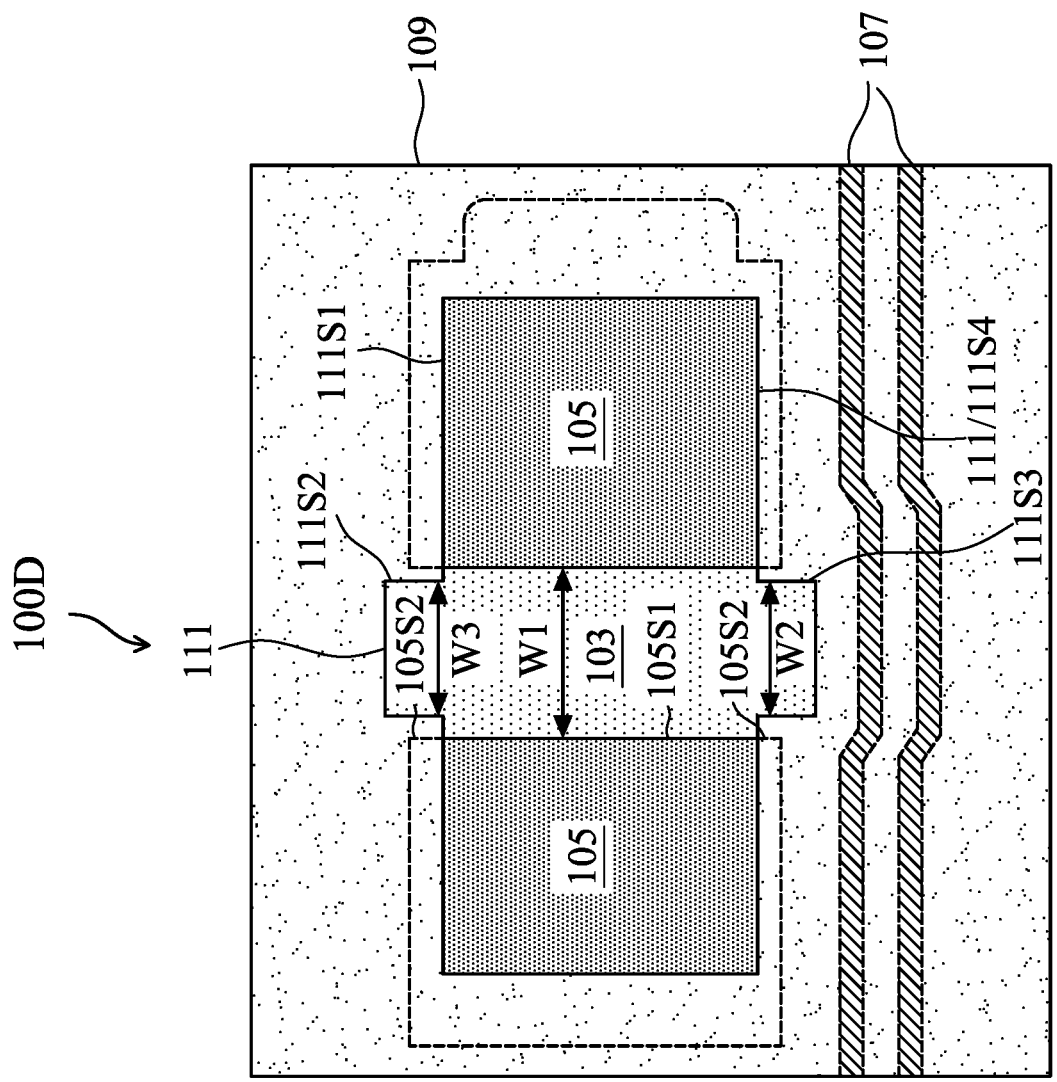
FIG. 12 illustrates a cross-sectional view of a semiconductor package, in accordance with another embodiment.

FIG. 12 illustrates a cross-sectional view of a semiconductor package 100D, in accordance with another embodiment. The semiconductor package 100D is similar to the semiconductor package 100C of FIG. 11, but the area 111C (e.g., the area between the bond pads 105) comprises a larger rectangular shaped area (with a width W1) and two smaller rectangular shaped area (with a width W2 and a width W3, respectively) on opposing sides of the larger rectangular shaped area. In some embodiments, the width W1 is larger than the widths W2 and W3, and W2 is different from W3. In some embodiments, the width W1 is larger than the widths W2 and W3, and W2 and W3 are the same. In FIG. 12, the second portion 105S2 and the third portion 105S3 of the sidewall of the bond pad 105 are covered by the dielectric layer 109.

Figure 13:
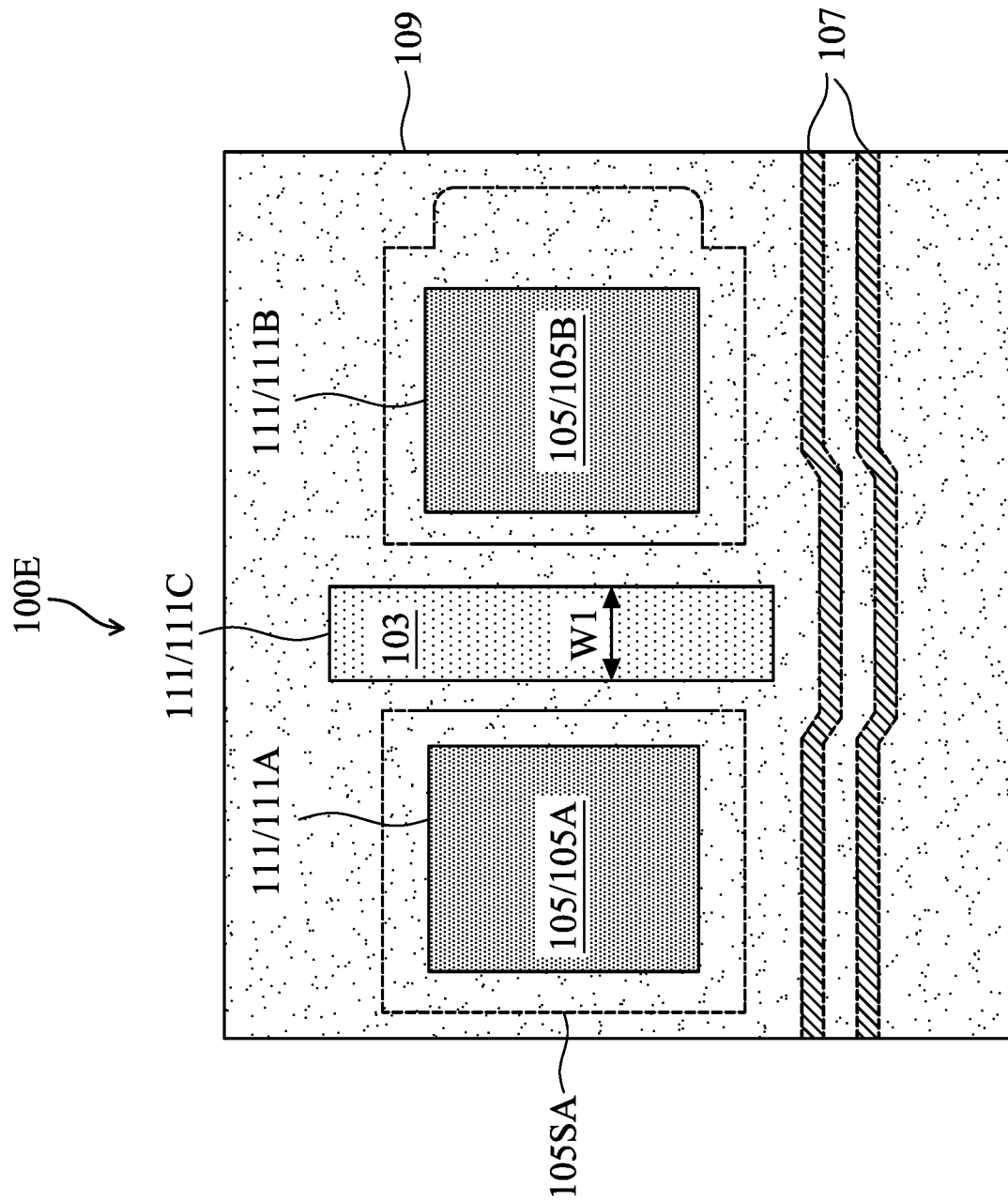
FIG. 13 illustrates a cross-sectional view of a semiconductor package, in accordance with yet another embodiment.

FIG. 13 illustrates a cross-sectional view of a semiconductor package 100E, in accordance with yet another embodiment. The opening 111 of the semiconductor package 100E includes three separate areas, such as an area 111A directly over the bond pad 105A, an area 111B directly over the bond pad 105B, and an area 111C between the areas 111A and 111B. In the top view of FIG. 13, the areas 111A and 111B are rectangular shaped areas that are disposed completely within the perimeters (e.g., sidewalls) of the respective underlying bond pads 105. Therefore, all of the sidewalls of the bond pads 105 are completely covered by the dielectric layer 109. The area 111C exposes a portion of the underlying dielectric layer 103. The area 111C is a rectangular area with a substantially constant width W1, and with a length (measured along a direction parallel to the sidewall 105SA of the bond pad 105A) larger than a length of the area 111A (or 111B). In some embodiments, the areas 111A and 111B have a same length that is smaller than the length of the area 111C.

Embodiments may achieve advantages. For example, the disclosed embodiments form the opening 111 with a beveled design, which covers a second portion 105S2 of the sidewall of the bond pad 105 adjacent to the conductive line 107. The beveled design of the opening helps to reduce or avoid the bridging issue, thereby improving the reliability of the semiconductor package formed and improving the production yield.

Figure 14:
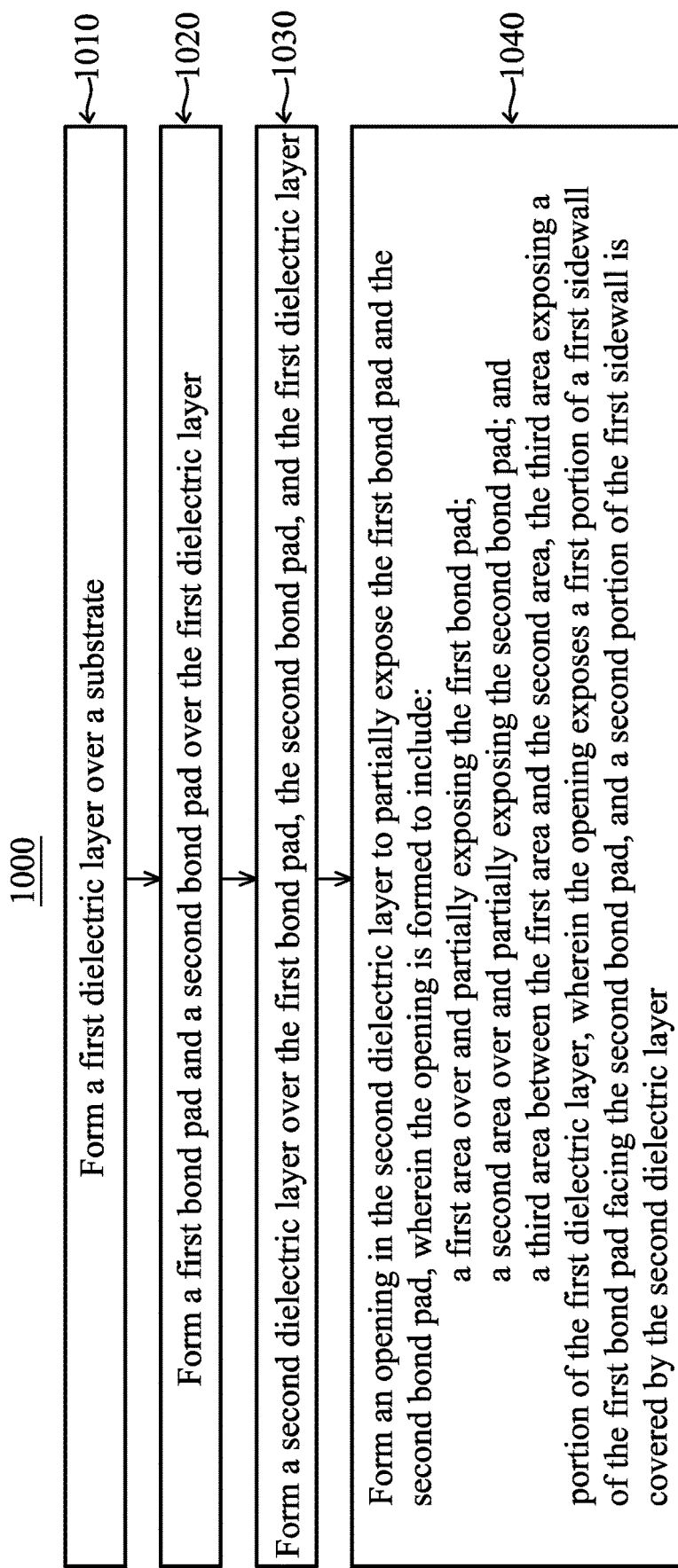
FIG. 14 illustrates a flow chart of a method of forming a semiconductor package, in some embodiments.

FIG. 14 illustrates a flow chart of a method 1000 of forming a semiconductor package, in accordance with some embodiments. It should be understood that the embodiment method shown in FIG. 14 is merely an example of many possible embodiment methods. One of ordinary skill in the art would recognize many variations, alternatives, and modifications. For example, various steps as illustrated in FIG. 14 may be added, removed, replaced, rearranged, or repeated.

Referring to FIG. 14, at block 1010, a first dielectric layer is formed over a substrate. At block 1020, a first bond pad and a second bond pad are formed over the first dielectric layer. At block 1030, a second dielectric layer is formed over the first bond pad, the second bond pad, and the first dielectric layer. At block 1040, an opening is formed in the second dielectric layer to partially expose the first bond pad and the second bond pad, wherein the opening is formed to include: a first area over and partially exposing the first bond pad; a second area over and partially exposing the second bond pad; and a third area between the first area and the second area, the third area exposing a portion of the first dielectric layer, wherein the opening exposes a first portion of a first sidewall of the first bond pad facing the second bond pad, and a second portion of the first sidewall is covered by the second dielectric layer.

In accordance with an embodiment, a semiconductor package includes: a substrate; a first dielectric layer over the substrate; a first bond pad and a second bond pad that are disposed over the first dielectric layer, the first bond pad having a first sidewall facing the second bond pad; a second dielectric layer over the first bond pad, the second bond pad, and the first dielectric layer; and an opening in the second dielectric layer, wherein in a top view, the opening comprises: a first area over and exposing a first portion of the first bond pad; a second area over and exposing a second portion of the second bond pad; and a third area between the first area and the second area, the third area exposing a portion of the first dielectric layer, wherein a third length of the third area, measured along a first direction parallel to the first sidewall of the first bond pad, is larger than a first length of the first area measured along the first direction, wherein a first portion of the first sidewall of the first bond pad is exposed by the opening, and a second portion of the first sidewall is covered by the second dielectric layer. In an embodiment, the third length is larger than a second length of the second area measured along the first direction. In an embodiment, in the top view, the first area of the opening has a first edge intersecting the first sidewall of the first bond pad, and the first portion and the second portion of the first sidewall are disposed on opposing sides of the first edge, wherein the third area of the opening has a second edge intersecting the first edge of the first area, wherein an angle between the first edge and the second edge is larger than 90 degrees. In an embodiment, in the top view, the first area of the opening further has a third edge different from the first edge, the third edge intersecting the first sidewall of the first bond pad, wherein the third area of the opening further has a fourth edge intersecting the third edge, wherein an angle between the third edge and the fourth edge is larger than 90 degrees. In an embodiment, in the top view, the first area of the opening further has a third edge different from the first edge, the third edge intersecting the first sidewall of the first bond pad, wherein the third area of the opening further has a fourth edge intersecting the third edge, wherein the third edge is perpendicular to the fourth edge. In an embodiment, in the top view, the first area of the opening has a first edge intersecting the first sidewall of the first bond pad, and the first portion and the second portion of the first sidewall are disposed on opposing sides of the first edge, wherein the third area of the opening has a second edge intersecting the first edge of the first area, wherein the first edge is perpendicular to the second edge. In an embodiment, the third area of the opening comprise a first rectangular shaped area, a second rectangular shaped area, and third rectangular shaped area between the first rectangular shaped area and the second rectangular shaped area, wherein a third width of the third rectangular shaped area is larger than a first width of the first rectangular shaped area and a second width of the second rectangular shaped area, wherein the first width, the second width, and the third width are measured along a second direction perpendicular to the first direction. In an embodiment, a third portion of the first sidewall is covered by the second dielectric layer, wherein the first portion of the first sidewall is disposed between the second portion of the first sidewall and the third portion of the first sidewall. In an embodiment, the second bond pad has a second sidewall facing the first bond pad, wherein the first sidewall and the second sidewall are parallel to each other. In an embodiment, the semiconductor package further includes a conductive line between the first dielectric layer and the second dielectric layer, wherein a closest distance between the first bond pad and the conductive line is less than about 25 µm. In an embodiment, the semiconductor package further includes: a surface mount device bonded to the first bond pad and the second bond pad; and an encapsulating material filling the opening in the second dielectric layer. In an embodiment, the second dielectric layer is solder resist.

In accordance with an embodiment, a semiconductor package includes: a substrate; a first dielectric layer over the substrate; a first bond pad and a second bond pad over the first dielectric layer, wherein the first bond pad has a first sidewall facing the second bond pad; a second dielectric layer over the first bond pad and the second bond pad; and an opening through the second dielectric layer, wherein the opening extends from the first bond pad to the second bond pad, wherein the opening comprises a first area over and exposing the first bond pad, wherein in a top view, the opening exposes a first segment of the first sidewall of the first bond pad, the first segment of the first sidewall being between a first edge of the first area and a second edge of the first area, the first edge and the second edge intersecting the first sidewall, wherein the first segment of the first sidewall is between a second segment of the first sidewall and a third segment of the first sidewall, wherein the second segment of the first sidewall is covered by the second dielectric layer. In an embodiment, the semiconductor package further includes a conductive line over the first dielectric layer and adjacent to the first bond pad and the second bond pad, wherein the conductive line extend along a second sidewall of the first bond pad intersecting the first sidewall, wherein the second segment of the first sidewall is between the first segment of the first sidewall and the conductive line. In an embodiment, the opening further comprises a second area between the first bond pad and the second bond pad, the second area exposing a portion of the first dielectric layer, wherein the second area has a protruding portion extending toward the conductive line, wherein a shortest distance between the protruding portion and the conductive line is smaller than a shortest distance between the first bond pad and the conductive line. In an embodiment, a distance between opposing sidewalls of the protruding portion decreases as the protruding portion extends toward the conductive line. In an embodiment, in the top view, the protruding portion has a rectangular shape.

In accordance with an embodiment, a method of forming a semiconductor package includes: forming a first dielectric layer over a substrate; forming a first bond pad and a second bond pad over the first dielectric layer; forming a second dielectric layer over the first bond pad, the second bond pad, and the first dielectric layer; and forming an opening in the second dielectric layer to partially expose the first bond pad and the second bond pad, wherein the opening is formed to include: a first area over and partially exposing the first bond pad; a second area over and partially exposing the second bond pad; and a third area between the first area and the second area, the third area exposing a portion of the first dielectric layer, wherein the opening exposes a first portion of a first sidewall of the first bond pad facing the second bond pad, and a second portion of the first sidewall is covered by the second dielectric layer. In an embodiment, a third length of the third area is formed to be larger than a first length of the first area and a second length of the second area, wherein the first length, the second length, and the third length are measured along a first direction parallel to the first sidewall. In an embodiment, the method further includes forming a conductive line adjacent to the first bond pad and the second bond pad, wherein in a top view, a width of the third area, measured along a second direction perpendicular to the first direction, decreases as the third area extends toward the conductive line.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor package comprising:
   a substrate;
   a first dielectric layer over the substrate;
   a first bond pad over the first dielectric layer;
   a second dielectric layer over the first bond pad and the first dielectric layer; and
   an opening in the second dielectric layer, wherein in a top view, the opening comprises a first area over and exposing a portion of the first bond pad, wherein the opening exposes a first segment of a first sidewall of the first bond pad, wherein a second segment of the first sidewall of the first bond pad and a third segment of the first sidewall of the first bond pad are covered by the second dielectric layer, wherein the first segment of the first sidewall is interposed between the second segment of the first sidewall and the third segment of the first sidewall.

2. The semiconductor package of claim 1, wherein a second sidewall of the first bond pad and a third sidewall of the first bond pad are covered by the second dielectric layer, wherein in the top view, the second sidewall of the first bond pad and the third sidewall of the first bond pad intersect with the first sidewall of the first bond pad.

3. The semiconductor package of claim 1, wherein the opening further comprises a second area laterally adjacent to the first area, wherein a second length of the second area, measured along a first direction parallel to the first sidewall of the first bond pad, is larger than a first length of the first area measured along the first direction.

4. The semiconductor package of claim 3, wherein the second area of the opening is connected to the first area of the opening.

5. The semiconductor package of claim 3, further comprising a second bond pad laterally adjacent to the first bond pad and disposed between the first dielectric layer and the second dielectric layer, wherein the opening further comprises a third area over and exposing a portion of the second bond pad, wherein the second area is between the first area and the third area.

6. The semiconductor package of claim 5, wherein the second length is larger than a third length of the third area measured along the first direction.

7. The semiconductor package of claim 3, wherein in the top view, the first area of the opening has a first edge intersecting the first sidewall of the first bond pad, and the second area of the opening has a second edge intersecting the first edge of the first area.

8. The semiconductor package of claim 7, wherein in the top view, an angle between the first edge and the second edge is equal to or larger than 90 degrees.

9. The semiconductor package of claim 7, wherein in the top view, the first segment of the first sidewall and the second segment of the first sidewall are disposed on opposing sides of the first edge.

10. The semiconductor package of claim 3, further comprising a conductive line laterally adjacent to the first bond pad and disposed between the first dielectric layer and the second dielectric layer, wherein the conductive line has a beveled design such that in the top view, a first segment of the conductive line adjacent to the second area of the opening extends further from a second sidewall of the first bond pad than a second segment of the conductive line adjacent to the first area of the opening, wherein the second sidewall of the first bond pad faces the conductive line.

11. The semiconductor package of claim 10, wherein the first segment of the conductive line and the second segment of the conductive line extend parallel to the second sidewall of the first bond pad, wherein a third segment of the conductive line connects the first segment of the conductive line and the second segment of the conductive line.

12. A semiconductor package comprising:
    a substrate;
    a first dielectric layer over the substrate;
    a first bond pad and a second bond pad over the first dielectric layer, wherein the first bond pad has a first sidewall facing the second bond pad;

a conductive line over the first dielectric layer and laterally adjacent to the first bond pad and the second bond pad, wherein the conductive line extends along a second sidewall of the first bond pad intersecting the first sidewall of the first bond pad;

a second dielectric layer over the first bond pad and the second bond pad; and an opening in the second dielectric layer, wherein the opening comprises a first area over and exposing the first bond pad, a second area over and exposing the second bond pad, and a third area between the first area and the second area, wherein the conductive line has a beveled design such that in a top view, a first segment of the conductive line adjacent to the first bond pad extends closer to the second sidewall of the first bond pad than a second segment of the conductive line adjacent to the third area of the opening.

13. The semiconductor package of claim 12, wherein in the top view, the opening exposes a first segment of the first sidewall of the first bond pad, wherein the first segment of the first sidewall is between a second segment of the first sidewall and a third segment of the first sidewall, wherein the second segment of the first sidewall and the third segment of the first sidewall are covered by the second dielectric layer.

14. The semiconductor package of claim 12, wherein a third length of the third area of the opening, measured along a first direction parallel to the first sidewall of the first bond pad, is larger than a first length of the first area of the opening and a second length of the second area of the opening measured along the first direction.

15. The semiconductor package of claim 14, wherein the third area of the opening comprises a protrusion that extends toward the second segment of the conductive line.

16. The semiconductor package of claim 15, wherein a first width of the protrusion, measured along a second direction perpendicular to the first direction, is smaller than a second width of another portion of the third area disposed between the first bond pad and the second bond pad.

17. The semiconductor package of claim 15, wherein in the top view, the protrusion has a rectangular shape or a trapezoidal shape.

18. A semiconductor package comprising:

a substrate;

a first dielectric layer over the substrate;

a first bond pad and a second bond pad over the first dielectric layer, wherein the first bond pad is spaced apart from the second bond pad, wherein a first sidewall of the first bond pad faces the second bond pad;

a second dielectric layer over the first bond pad and the second bond pad; and an opening in the second dielectric layer, wherein the opening comprises a first area over and exposing the first bond pad, a second area over and exposing the second bond pad, and a third area between the first area and the second area, wherein the third area exposes the first dielectric layer, wherein the first area, the second area, and the third area have a first length, a second length, and a third length, respectively, measured along a first direction parallel to the first sidewall, wherein the third length is larger than the first length and the second length.

19. The semiconductor package of claim 18, wherein the first length is larger than a fourth length of the first sidewall measured along the first direction.

20. The semiconductor package of claim 18, wherein a first segment of the first sidewall is exposed by the first area of the opening, wherein a second segment of the first sidewall and a third segment of the first sidewall are covered by the second dielectric layer, wherein the first segment of the first sidewall is disposed between the second segment and the third segment of the first sidewall.

* * * * *